United States Patent
Hallin

(10) Patent No.: US 9,608,085 B2
(45) Date of Patent: Mar. 28, 2017

(54) PREDISPOSED HIGH ELECTRON MOBILITY TRANSISTOR

(71) Applicant: Cree, Inc., Durham, NC (US)

(72) Inventor: Christer Hallin, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/632,395

(22) Filed: Oct. 1, 2012

(65) Prior Publication Data

US 2014/0091309 A1   Apr. 3, 2014

(51) Int. Cl.
| | |
|---|---|
| *H01L 29/778* | (2006.01) |
| *H01L 29/812* | (2006.01) |
| *H01L 29/66* | (2006.01) |
| *H01L 29/20* | (2006.01) |

(52) U.S. Cl.
CPC .... *H01L 29/66462* (2013.01); *H01L 29/7787* (2013.01); *H01L 29/2003* (2013.01)

(58) Field of Classification Search
CPC ............... H01L 29/778; H01L 29/7786; H01L 29/7787; H01L 29/66446; H01L 29/66893; H01L 29/66924
See application file for complete search history.

(56) References Cited

U.S. PATENT DOCUMENTS

| | | | | |
|---|---|---|---|---|
| 6,787,820 B2* | 9/2004 | Inoue | ................... | H01L 29/7783 257/192 |
| 7,709,859 B2* | 5/2010 | Smith | ................... | H01L 21/318 257/194 |
| 7,714,360 B2* | 5/2010 | Otsuka | ................... | H01L 23/293 257/192 |
| 7,795,622 B2* | 9/2010 | Kikkawa et al. | ............... | 257/76 |
| 8,030,164 B2* | 10/2011 | Kikkawa et al. | ............. | 438/285 |
| 8,344,423 B2* | 1/2013 | Uemoto | ............. | H01L 29/1066 257/192 |
| 8,603,880 B2* | 12/2013 | Yamada | ............. | H01L 29/2003 257/192 |
| 8,933,489 B2* | 1/2015 | Kikkawa | ............... | H01L 29/778 257/200 |

(Continued)

OTHER PUBLICATIONS

Ostermaier, Clemens et al.,"Ultrathin InAlN/AlN Barrier HEMT with High Performance in Normally Off Operation", IEEE Electron Device Letters, Oct. 2009, pp. 1030-1032, vol. 30, No. 10.

(Continued)

*Primary Examiner* — Cheung Lee
*Assistant Examiner* — Stephen C Smith
(74) *Attorney, Agent, or Firm* — Myers Bigel, P.A.

(57) ABSTRACT

A predisposed high electron mobility transistor (HEMT) is disclosed. The predisposed HEMT includes a buffer layer, a HEMT channel layer on the buffer layer, a first HEMT barrier layer over the HEMT channel layer, and a HEMT cap layer on the first HEMT barrier layer. The HEMT cap layer has a drain region, a source region, and a gate region. Further, the HEMT cap layer has a continuous surface on the drain region, the source region, and the gate region. When no external voltage is applied between the source region and the gate region, the gate region either depletes carriers from the HEMT channel layer or provides carriers to the HEMT channel layer, thereby selecting a predisposed state of the predisposed HEMT.

19 Claims, 4 Drawing Sheets

(56) References Cited

U.S. PATENT DOCUMENTS

| | | | |
|---|---|---|---|
| 2006/0220165 A1* | 10/2006 | Hase | H01L 29/7785 257/471 |
| 2007/0164315 A1* | 7/2007 | Smith | H01L 21/318 257/194 |
| 2008/0197359 A1 | 8/2008 | Imanishi et al. | |
| 2009/0212326 A1* | 8/2009 | Sato | 257/192 |
| 2011/0233521 A1* | 9/2011 | Saxler | H01L 21/02458 257/24 |
| 2012/0211760 A1* | 8/2012 | Yamada | H01L 29/2003 257/76 |
| 2012/0313145 A1* | 12/2012 | Makabe | H01L 21/02378 257/194 |

OTHER PUBLICATIONS

Invitation to Pay Additional Fees for PCT/US2013/061795, mailed Dec. 20, 2013, 6 pages.
International Search Report and Written Opinion for PCT/US2013/061795, mailed Jun. 12, 2014, 15 pages.
International Preliminary Report on Patentability for PCT/US2013/061795, mailed Apr. 16, 2015, 10 pages.

\* cited by examiner

US 9,608,085 B2

PREDISPOSED HIGH ELECTRON MOBILITY TRANSISTOR

FIELD OF THE DISCLOSURE

The present disclosure relates to high electron mobility transistors.

BACKGROUND

A high electron mobility transistor (HEMT) is a field effect transistor (FET) that uses a junction between two materials that have different band gaps, different polarization, or both. One of the materials provides a non-doped channel and the other material provides carriers, such as electrons, to the non-doped channel. Channels in traditional FETs are typically doped with impurities to provide carriers. However, the carriers may be slowed down as a result of collisions with the impurities that provide the carriers. A HEMT avoids this problem by using the non-doped channel, which doesn't have the impurities. The other material provides the carriers to the non-doped channel as a thin sub-layer of highly mobile carriers in the non-doped channel adjacent to the other material. This thin sub-layer is called a two-dimensional electron gas (2DEG) sub-layer. As a result, the non-doped channel may have low resistivity to provide high electron mobility. As in the fabrication of most semiconductor devices, there is a need to fabricate HEMTs using cost effective, reliable, and simple fabrication methods.

SUMMARY

Embodiments of the present disclosure relate to a predisposed high electron mobility transistor (HEMT). The predisposed HEMT includes a buffer layer, a HEMT channel layer on the buffer layer, a first HEMT barrier layer over the HEMT channel layer, and a HEMT cap layer on the first HEMT barrier layer. The HEMT cap layer has a drain region, a source region, and a gate region. Further, the HEMT cap layer has a continuous surface on the drain region, the source region, and the gate region. When no external voltage is applied between the source region and the gate region, the gate region either depletes carriers from the HEMT channel layer or provides carriers to the HEMT channel layer, thereby selecting a predisposed state of the predisposed HEMT.

In one embodiment of the predisposed HEMT, the predisposed HEMT is a normally OFF HEMT. In this regard, a bandgap difference and a polarization difference between the HEMT channel layer and the first HEMT barrier layer attracts available carriers, such as electrons, in the first HEMT barrier layer into the HEMT channel layer. However, when the gate region depletes the available carriers from the HEMT channel layer, the HEMT channel layer is starved of carriers, thereby selecting the OFF state of the normally OFF HEMT. As such, it is not necessary to segment the HEMT cap layer to fabricate the normally OFF HEMT. As a result, the HEMT cap layer has the continuous surface, thereby simplifying fabrication.

In an alternate embodiment of the predisposed HEMT, the predisposed HEMT is a normally ON HEMT. In this regard, a bandgap difference and a polarization difference between the HEMT channel layer and the first HEMT barrier layer provides available carriers in the first HEMT barrier layer into the HEMT channel layer, thereby selecting the ON state of the normally ON HEMT. As such, it is not necessary to segment the HEMT cap layer to fabricate the normally ON HEMT. As a result, the HEMT cap layer has the continuous surface, thereby simplifying fabrication.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
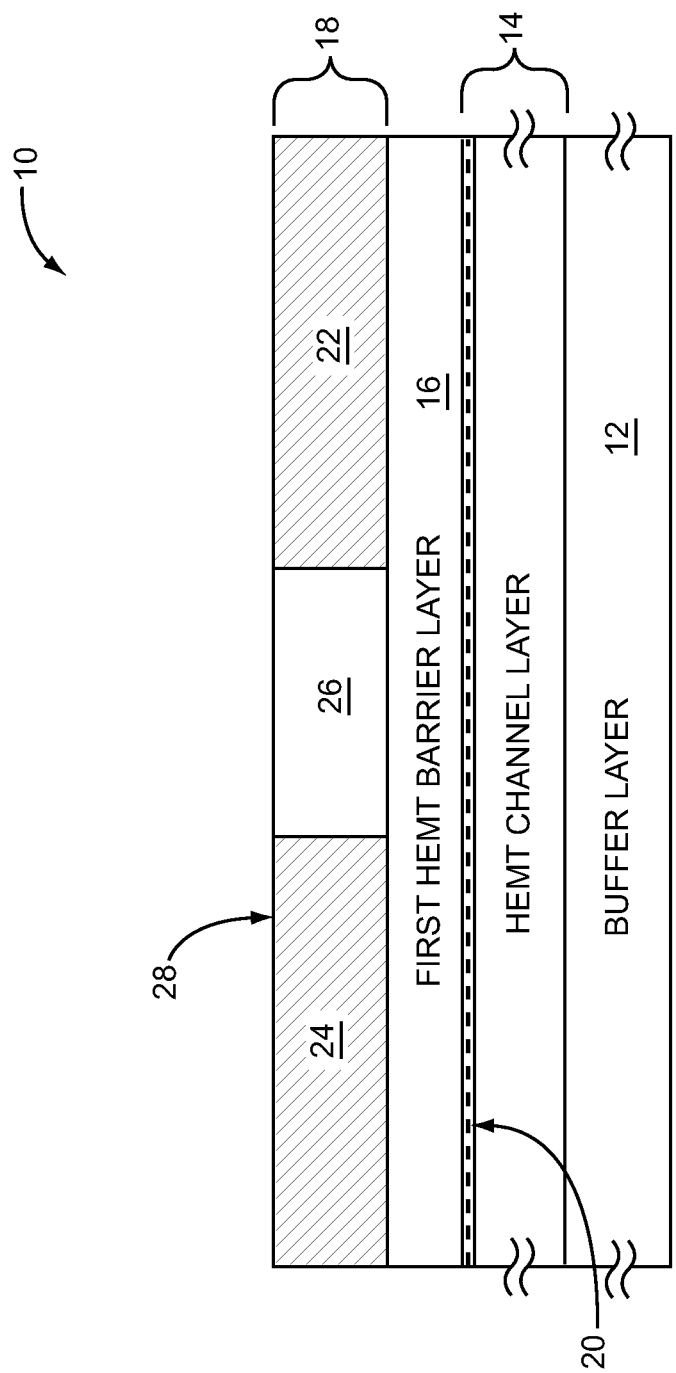
FIG. 1 shows a predisposed high electron mobility transistor (HEMT) according to one embodiment of the predisposed HEMT.

FIG. 1 shows a predisposed HEMT 10 according to one embodiment of the predisposed HEMT 10. The predisposed HEMT 10 includes a buffer layer 12, a HEMT channel layer 14 on the buffer layer 12, a first HEMT barrier layer 16 over the HEMT channel layer 14, and a HEMT cap layer 18 on the first HEMT barrier layer 16. The HEMT channel layer 14 has a two-dimensional electron gas (2DEG) sub-layer 20. The HEMT cap layer 18 has a drain region 22, a source region 24, and a gate region 26. Further, the HEMT cap layer 18 has a continuous surface 28 on the drain region 22, the source region 24, and the gate region 26. In one embodiment of the predisposed HEMT 10, the drain region 22 is adjacent to the gate region 26, and the source region 24 is adjacent to the gate region 26.

In one embodiment of the predisposed HEMT, the predisposed HEMT is a normally OFF HEMT. As such, when no external voltage is applied between the source region 24 and the gate region 26, the gate region 26 depletes carriers from the HEMT channel layer 14, thereby selecting an OFF state of the predisposed HEMT 10. In this regard, a bandgap difference and a polarization difference between the HEMT channel layer 14 and the first HEMT barrier layer 16 attracts available carriers, such as electrons, in the first HEMT barrier layer 16 into the HEMT channel layer 14. However, when the gate region 26 depletes the available carriers from the HEMT channel layer 14, the HEMT channel layer 14 is starved of carriers, thereby selecting the OFF state of the predisposed HEMT 10. As such, it is not necessary to segment the HEMT cap layer 18 to fabricate the predisposed HEMT 10. As a result, the HEMT cap layer 18 has the continuous surface 28, thereby simplifying fabrication.

In an alternate embodiment of the predisposed HEMT 10, the predisposed HEMT 10 is a normally ON HEMT. In this regard, a bandgap difference and a polarization difference between the HEMT channel layer 14 and the first HEMT barrier layer 16 provides available carriers in the first HEMT barrier layer 16 into the HEMT channel layer 14, thereby selecting the ON state of the predisposed HEMT 10. As such, it is not necessary to segment the HEMT cap layer 18 to fabricate the predisposed HEMT 10. As a result, the HEMT cap layer 18 has the continuous surface 28, thereby simplifying fabrication.

The continuous surface 28 may preclude a need for etching away the HEMT cap layer 18 between or near the drain region 22, the source region 24, and the gate region 26, thereby simplifying fabrication of the predisposed HEMT 10. In one embodiment of the predisposed HEMT 10, the continuous surface 28 is about planar. In an alternate embodiment of the predisposed HEMT 10, the continuous surface 28 is not planar. In one embodiment of the predisposed HEMT 10, the gate region 26 includes a first type of semiconductor doping. Further, the drain region 22 and the source region 24 each includes a second type of semiconductor doping, which is opposite from the first type of semiconductor doping. In one embodiment of the HEMT cap layer 18, the first type of semiconductor doping is P-type semiconductor doping and the second type of semiconductor doping is N-type semiconductor doping. In one embodiment of the HEMT cap layer 18, the first type of semiconductor doping is Carbon doping. In one embodiment of the HEMT cap layer 18, the second type of semiconductor doping is Silicon implantation doping. In an alternate embodiment of the HEMT cap layer 18, the second type of semiconductor doping is Oxygen doping.

In a first embodiment of the HEMT cap layer 18, a carrier concentration of the first type of semiconductor doping is between about $1 \times e^{17}$ carriers per cubic centimeter and about $5 \times e^{19}$ carriers per cubic centimeter. In a second embodiment of the HEMT cap layer 18, the carrier concentration of the first type of semiconductor doping is between about $1 \times e^{17}$ carriers per cubic centimeter and about $5 \times e^{18}$ carriers per cubic centimeter. In a third embodiment of the HEMT cap layer 18, the carrier concentration of the first type of semiconductor doping is between about $1 \times e^{17}$ carriers per cubic centimeter and about $1 \times e^{18}$ carriers per cubic centimeter. In a fourth embodiment of the HEMT cap layer 18, a carrier concentration of the second type of semiconductor doping is between about $1 \times e^{17}$ carriers per cubic centimeter and about $5 \times e^{19}$ carriers per cubic centimeter. In a fifth embodiment of the HEMT cap layer 18, the carrier concentration of the second type of semiconductor doping is between about $1 \times e^{17}$ carriers per cubic centimeter and about $5 \times e^{18}$ carriers per cubic centimeter. In a sixth embodiment of the HEMT cap layer 18, the carrier concentration of the second type of semiconductor doping is between about $1 \times e^{17}$ carriers per cubic centimeter and about $1 \times e^{18}$ carriers per cubic centimeter.

In one embodiment of the predisposed HEMT 10, the HEMT channel layer 14 and the first HEMT barrier layer 16 are not actively doped. However, even if the HEMT channel layer 14 is not actively doped, if the buffer layer 12 is doped with iron, or similar material, a memory effect may occur in which after shutting off the iron doping, a long declining doping tail may be created in the HEMT channel layer 14. In general, even if the HEMT channel layer 14 is not actively doped, it might still be doped due to a memory effect from an adjacent layer. In a first embodiment of the HEMT channel layer 14, a thickness of the HEMT channel layer 14 is between about 20 nanometers and about 40 nanometers. In a second embodiment of the HEMT channel layer 14, the thickness of the HEMT channel layer 14 is between about 10 nanometers and about 50 nanometers. In a third embodiment of the HEMT channel layer 14, the thickness of the HEMT channel layer 14 is between about 10 nanometers and about 100 nanometers.

In a fourth embodiment of the HEMT channel layer 14, the thickness of the HEMT channel layer 14 is between about 20 nanometers and about 1000 nanometers. In a fifth embodiment of the HEMT channel layer 14, the thickness of the HEMT channel layer 14 is between about 100 nanometers and about 1000 nanometers. In a sixth embodiment of the HEMT channel layer 14, the thickness of the HEMT channel layer 14 is between about 200 nanometers and about 1000 nanometers. In a seventh embodiment of the HEMT channel layer 14, the thickness of the HEMT channel layer 14 is between about 500 nanometers and about 1000 nanometers.

In a first embodiment of the first HEMT barrier layer 16, a thickness of the first HEMT barrier layer 16 is between about 1 nanometer and about 3 nanometers. In a second embodiment of the first HEMT barrier layer 16, the thickness of the first HEMT barrier layer 16 is between about 1 nanometer and about 5 nanometers. In a third embodiment of the first HEMT barrier layer 16, the thickness of the first HEMT barrier layer 16 is between about 0.5 nanometers and about 10 nanometers.

In one embodiment of the HEMT cap layer 18, a thickness of the HEMT cap layer 18 is between about 3 nanometers and about 7 nanometers. In an alternate embodiment of the HEMT cap layer 18, the thickness of the HEMT cap layer 18 is between about 2 nanometers and about 20 nanometers. In a further embodiment of the HEMT cap layer 18, the thickness of the HEMT cap layer 18 is between about 2 nanometers and about 40 nanometers. In another embodiment of the HEMT cap layer 18, the thickness of the HEMT cap layer 18 is between about 1 nanometer and about 100 nanometers.

In one embodiment of the HEMT channel layer 14, the HEMT channel layer 14 includes at least one Nitride of Group III of a Periodic Table of the Elements. In this regard, the HEMT channel layer 14 may include any ternary combinations of Nitrogen with elements from Group III of the Periodic Table of the Elements. Group III of the Periodic Table of the Elements includes Boron, Aluminum, Gallium, Indium, and Thallium. As such, the nitrides of Group III include Boron Nitride, Aluminum Nitride, Gallium Nitride, Indium Nitride, and Thallium Nitride. In a first exemplary embodiment of the HEMT channel layer 14, the HEMT channel layer 14 includes Gallium Nitride. In a second exemplary embodiment of the HEMT channel layer 14, the HEMT channel layer 14 includes Aluminum Nitride. In a third exemplary embodiment of the HEMT channel layer 14, the HEMT channel layer 14 includes Indium Nitride.

In one embodiment of the first HEMT barrier layer 16, the first HEMT barrier layer 16 includes at least one Nitride of Group III of the Periodic Table of the Elements. In this regard, the first HEMT barrier layer 16 may include any ternary combinations of Nitrogen with elements from Group III of the Periodic Table of the Elements. In a first exemplary embodiment of the first HEMT barrier layer 16, the first HEMT barrier layer 16 includes Gallium Nitride. In a second exemplary embodiment of the first HEMT barrier layer 16, the first HEMT barrier layer 16 includes Aluminum Nitride. In a third exemplary embodiment of the first HEMT barrier layer 16, the first HEMT barrier layer 16 includes Indium Nitride. In a fourth exemplary embodiment of the first HEMT barrier layer 16, the first HEMT barrier layer 16 includes Aluminum Indium Nitride, which is an alloy of Aluminum Nitride and Indium Nitride. In one embodiment of the Aluminum Indium Nitride, a concentration of the Indium Nitride in the Aluminum Indium Nitride is equal to about 17 percent. In an alternate embodiment of the Aluminum Indium Nitride, the concentration of the Indium Nitride in the Aluminum Indium Nitride is equal to about 18 percent. In an additional embodiment of the Aluminum Indium Nitride, the concentration of the Indium Nitride in the Aluminum Indium Nitride is equal to about 16 percent. In another embodiment of the Aluminum Indium Nitride, the concentration of the Indium Nitride in the Aluminum Indium Nitride is equal to about 19 percent. Using about 17 percent or about 18 percent indium Nitride may provide a good lattice match between the first HEMT barrier layer 16 and the HEMT channel layer 14.

In one embodiment of the HEMT cap layer 18, the HEMT cap layer 18 includes at least one Nitride of Group III of the Periodic Table of the Elements. In this regard, the HEMT cap layer 18 may include any ternary combinations of Nitrogen with elements from Group III of the Periodic Table of the Elements. For example, Aluminum Gallium Nitride, which is an alloy of Aluminum Nitride and Gallium Nitride, is a ternary combination of Nitrogen with Aluminum and Gallium. Since both Aluminum and Gallium are elements from Group III of the Periodic Table of the Elements, Aluminum Gallium Nitride is an example of a ternary combination of Nitrogen with elements from Group III of the Periodic Table of the Elements. In a first exemplary embodiment of the HEMT cap layer 18, the HEMT cap layer 18 includes Gallium Nitride. In a second exemplary embodiment of the HEMT cap layer 18, the HEMT cap layer 18 includes Aluminum Nitride. In a third exemplary embodiment of the HEMT cap layer 18, the HEMT cap layer 18 includes Indium Nitride.

In one embodiment of the buffer layer 12, a thickness of the buffer layer 12 is between about 1.5 micrometers and about 2 micrometers. In an alternate embodiment of the buffer layer 12, the thickness of the buffer layer 12 is between about 1 micrometer and about 5 micrometers. In a further embodiment of the buffer layer 12, the thickness of the buffer layer 12 is between about 0.5 micrometers and about 10 micrometers. In one embodiment of the predisposed HEMT 10, the buffer layer 12 is omitted.

In one embodiment of the buffer layer 12, the buffer layer 12 includes at least one Nitride of Group III of the Periodic Table of the Elements. In this regard, the buffer layer 12 may include any ternary combinations of Nitrogen with elements from Group III of the Periodic Table of the Elements. In a first exemplary embodiment of the buffer layer 12, the buffer layer 12 includes Gallium Nitride. In a second exemplary embodiment of the buffer layer 12, the buffer layer 12 includes Aluminum Nitride. In a third exemplary embodiment of the buffer layer 12, the buffer layer 12 includes Indium Nitride. In a fourth exemplary embodiment of the buffer layer 12, the buffer layer 12 includes Aluminum Gallium Nitride, which is an alloy of Aluminum Nitride and Gallium Nitride.

Figure 2:
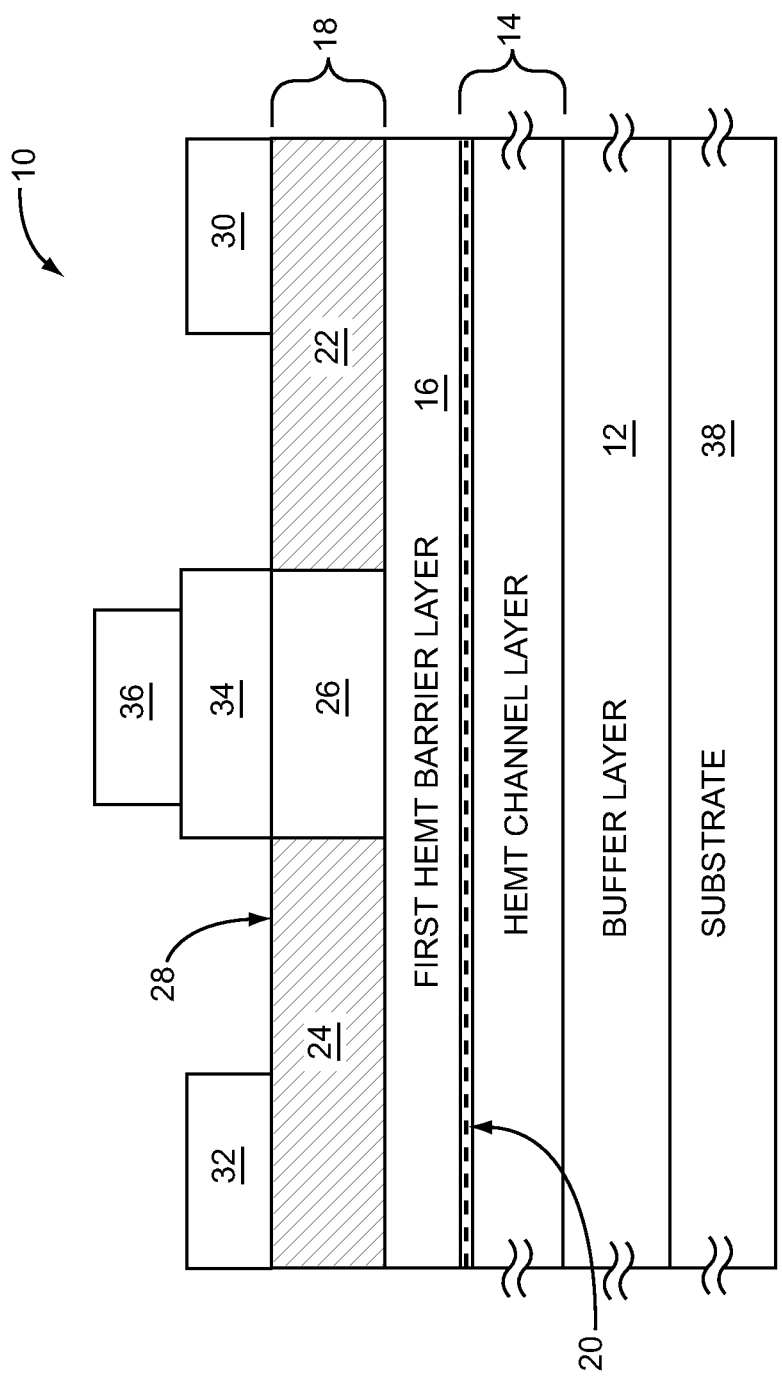
FIG. 2 shows the predisposed HEMT according to an alternate embodiment of the predisposed HEMT.

FIG. 2 shows the predisposed HEMT 10 according to an alternate embodiment of the predisposed HEMT 10. The predisposed HEMT 10 illustrated in FIG. 2 is similar to the predisposed HEMT 10 illustrated in FIG. 1, except the predisposed HEMT 10 illustrated in FIG. 2 further includes a drain 30 on the drain region 22, a source 32 on the source region 24, a gate oxide 34 on the gate region 26, a gate 36 on the gate oxide 34, and a substrate 38, such that the buffer layer 12 is on the substrate 38. In an alternate embodiment of the predisposed HEMT 10, the buffer layer 12 is omitted, such that the HEMT channel layer 14 is on the substrate 38.

In one embodiment of the predisposed HEMT 10, the gate oxide 34 is on the HEMT cap layer 18 to shield the gate region 26 from the second type of semiconductor doping, thereby leaving the first type of semiconductor doping intact. In one embodiment of the substrate 38, the substrate 38 includes Gallium Nitride. In an alternate embodiment of the substrate 38, the substrate 38 includes Silicon. In an additional embodiment of the substrate 38, the substrate 38 includes Silicon Carbide. In one embodiment of the buffer layer 12, the buffer layer 12 includes Gallium Nitride or Aluminum Gallium Nitride, either of which may provide a good lattice match to the substrate 38.

Figure 3:
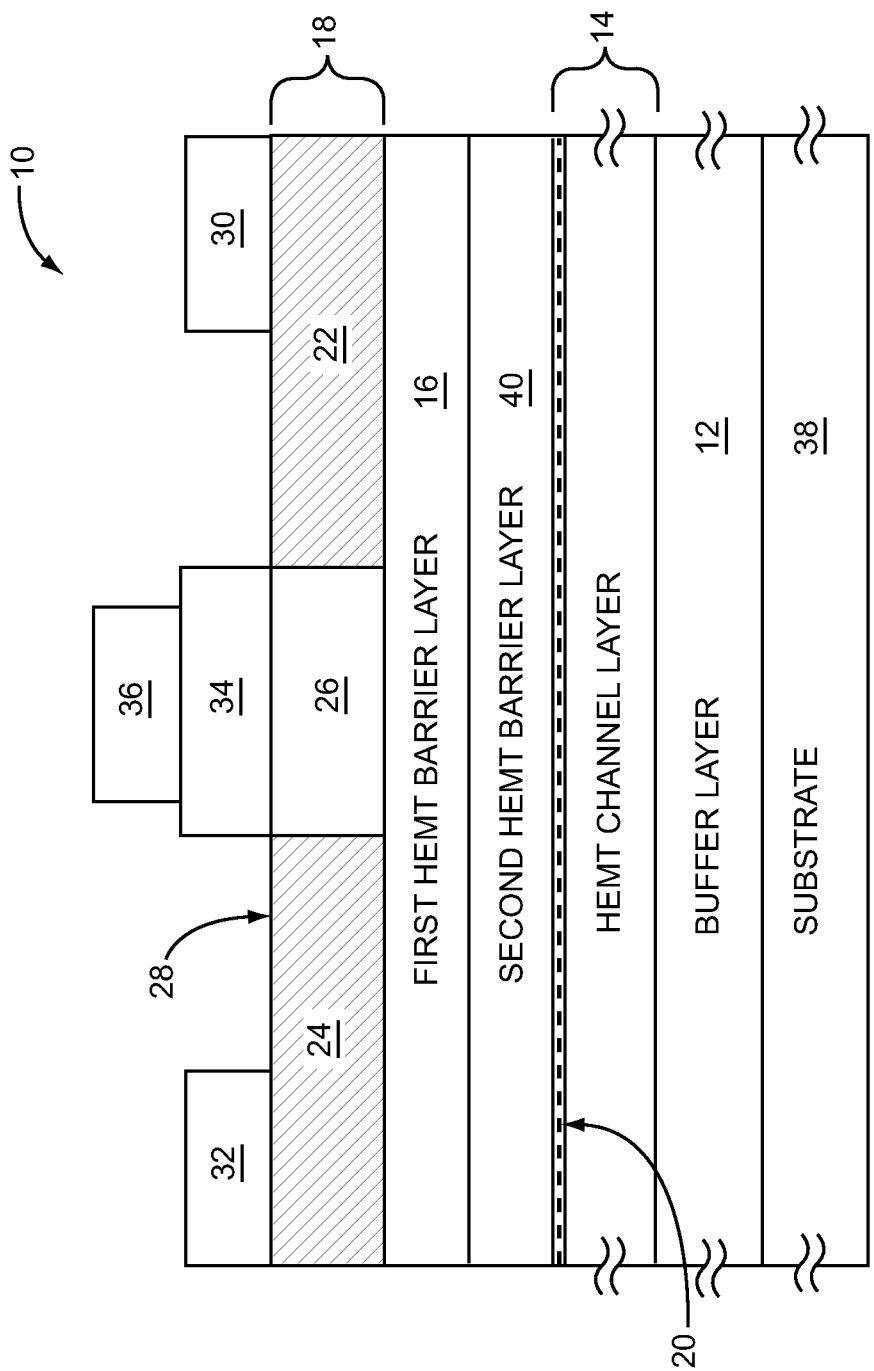
FIG. 3 shows the predisposed HEMT according to an additional embodiment of the predisposed HEMT.

FIG. 3 shows the predisposed HEMT 10 according to an additional embodiment of the predisposed HEMT 10. The predisposed HEMT 10 illustrated in FIG. 3 is similar to the predisposed HEMT 10 illustrated in FIG. 2, except the predisposed HEMT 10 illustrated in FIG. 3 further includes a second HEMT barrier layer 40 on the HEMT channel layer 14, such that the first HEMT barrier layer 16 is on the second HEMT barrier layer 40. The second HEMT barrier layer 40 may provide a smooth transition from the first HEMT barrier layer 16 to the HEMT channel layer 14.

In one embodiment of the second HEMT barrier layer 40, the second HEMT barrier layer 40 includes at least one Nitride of Group III of the Periodic Table of the Elements. In this regard, the second HEMT barrier layer 40 may include any ternary combinations of Nitrogen with elements from Group III of the Periodic Table of the Elements. In a first exemplary embodiment of the second HEMT barrier layer 40, the second HEMT barrier layer 40 includes Aluminum Nitride. In a second exemplary embodiment of the second HEMT barrier layer 40, the second HEMT barrier layer 40 includes Gallium Nitride. In a third exemplary embodiment of the second HEMT barrier layer 40, the second HEMT barrier layer 40 includes Indium Nitride.

In a first embodiment of the second HEMT barrier layer 40, a thickness of the second HEMT barrier layer 40 is between about 1 nanometer and about 1.5 nanometers. In a second embodiment of the second HEMT barrier layer 40, the thickness of the second HEMT barrier layer 40 is between about 0.5 nanometers and about 1.5 nanometers. In a third embodiment of the second HEMT barrier layer 40, the thickness of the second HEMT barrier layer 40 is between about 0.5 nanometers and about 2 nanometers. In a fourth embodiment of the second HEMT barrier layer 40, the thickness of the second HEMT barrier layer 40 is between about 0.1 nanometers and about 2 nanometers. In a fifth embodiment of the second HEMT barrier layer 40, the thickness of the second HEMT barrier layer 40 is between about 0.1 nanometers and about 1.5 nanometers. In one embodiment of the second HEMT barrier layer 40, the second HEMT barrier layer 40 is not doped.

Figure 4:
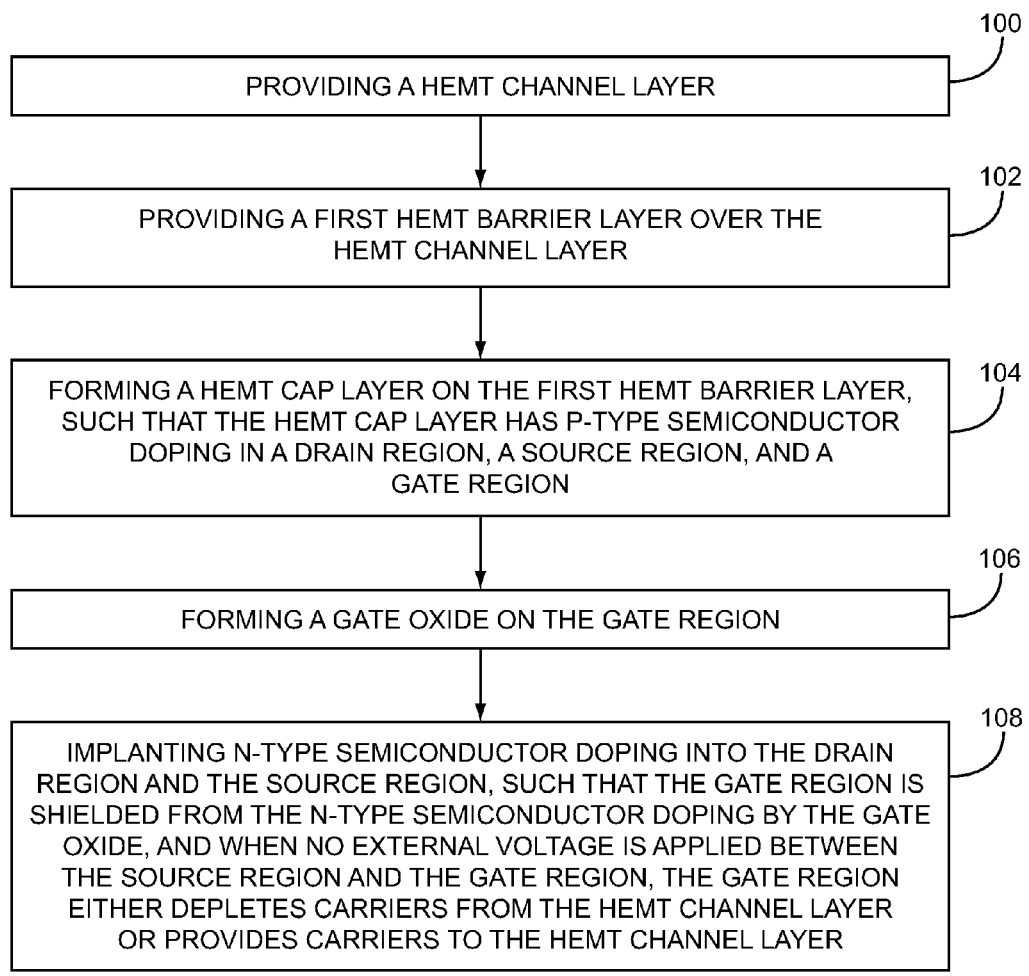
FIG. 4 illustrates a process for fabricating the predisposed HEMT illustrated in FIG. 2 according to one embodiment of the process.

FIG. 4 illustrates a process for fabricating the predisposed HEMT 10 illustrated in FIG. 2 according to one embodiment of the process. The process begins by providing the HEMT channel layer 14 (FIG. 2) (Step 100). The process continues by providing the first HEMT barrier layer 16 (FIG. 2) over the HEMT channel layer 14 (FIG. 2) (Step 102). The process continues by forming the HEMT cap layer 18 (FIG. 2) on the first HEMT barrier layer 16 (FIG. 2), such that the HEMT cap layer 18 (FIG. 2) has P-type semiconductor doping in the drain region 22 (FIG. 2), the source region 24 (FIG. 2), and the gate region 26 (FIG. 2) (Step 104). The process proceeds by forming the gate oxide 34 (FIG. 2) on the gate region 26 (FIG. 2) (Step 106). The process concludes by implanting N-type semiconductor doping into the drain region 22 (FIG. 2) and the source region 24 (FIG. 2), such that the gate region 26 (FIG. 2) is shielded from the N-type semiconductor doping by the gate oxide 34 (FIG. 2), and when no external voltage is applied between the source region 24 (FIG. 2) and the gate region 26 (FIG. 2), the gate region 26 (FIG. 2) either depletes carriers from the HEMT channel layer 14 (FIG. 2), thereby selecting the OFF state of the predisposed HEMT 10, (FIG. 2) or provides carriers to the HEMT channel layer 14 (FIG. 2), thereby selecting the ON state of the predisposed HEMT 10. (FIG. 2) (Step 108).

As previously presented, the HEMT cap layer 18 (FIG. 2) has the continuous surface 28 (FIG. 2) on the drain region 22 (FIG. 2), the source region 24 (FIG. 2), and the gate region 26 (FIG. 2). After implanting the N-type semiconductor doping, the drain region 22 (FIG. 2) and the source region 24 (FIG. 2) include N-type semiconductor material, and the gate region 26 (FIG. 2) includes P-type semiconductor material, which depletes carriers from the HEMT channel layer 14 (FIG. 2). In one embodiment of the process, during the forming of the HEMT cap layer 18 (FIG. 2), Carbon doping provides the P-type semiconductor doping. In one embodiment of the process, the drain region 22 (FIG. 2), the source region 24 (FIG. 2), and the gate region 26 (FIG. 2) are formed concurrently.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. A predisposed high electron mobility transistor (HEMT) comprising:
    a Gallium Nitride HEMT channel layer;
    a first Aluminum Indium Nitride HEMT barrier layer on the Gallium Nitride HEMT channel layer; and
    a Group III Nitride HEMT cap layer having a first surface and a second surface opposite the first surface on the first Aluminum Indium Nitride HEMT barrier layer, the first Aluminum Indium Nitride HEMT barrier layer having a good lattice match with the Gallium Nitride HEMT channel layer, wherein:
        the Group III Nitride HEMT cap layer is doped to include a drain region, a source region, and a gate region, wherein:
            the Group III Nitride HEMT cap layer has a continuous surface on the drain region, the source region, and the gate region;
            the gate region comprises a first type of semiconductor doping; and
            the drain region and the source region each comprise a second type of semiconductor doping, which is opposite from the first type of semiconductor doping; and
        when no external voltage is applied between the source region and the gate region, the gate region depletes carriers from the Gallium Nitride HEMT channel layer so that the predisposed HEMT is a normally OFF HEMT,
    wherein a thickness of the first Aluminum Indium Nitride HEMT barrier layer is between about 1 nanometer and about 3 nanometers.

2. The predisposed HEMT of claim 1 wherein the continuous surface is about planar, and wherein an Indium Nitride concentration in the first Aluminum Indium Nitride HEMT barrier layer is equal to about 17 percent or to about 18 percent.

3. The predisposed HEMT of claim 2 wherein the first type of semiconductor doping is Carbon doping.

4. The predisposed HEMT of claim 3 wherein the second type of semiconductor doping is Silicon implantation doping.

5. The predisposed HEMT of claim 3 wherein the second type of semiconductor doping is Oxygen doping.

6. The predisposed HEMT of claim 1 wherein a carrier concentration of the first type of semiconductor doping is between about $1 \times e^{17}$ carriers per cubic centimeter and about $5 \times e^{19}$ carriers per cubic centimeter.

7. The predisposed HEMT of claim 1 wherein a carrier concentration of the second type of semiconductor doping is between about $1 \times e^{17}$ carriers per cubic centimeter and about $5 \times e^{19}$ carriers per cubic centimeter.

8. The predisposed HEMT of claim 1 further comprising gate oxide on the Group III Nitride HEMT cap layer, such that the gate oxide shields the gate region from the second type of semiconductor doping.

9. The predisposed HEMT of claim 1 wherein the Gallium Nitride HEMT channel layer and the first Aluminum Indium Nitride HEMT barrier layer are not actively doped.

10. The predisposed HEMT of claim 1 wherein a thickness of the Gallium Nitride HEMT channel layer is between about 20 nanometers and about 40 nanometers.

11. The predisposed HEMT of claim 1 further comprising a second Group III Nitride HEMT barrier layer on the Group III Nitride HEMT channel layer, such that the first Aluminum Indium Nitride HEMT barrier layer is on the second Group III Nitride HEMT barrier layer.

12. The predisposed HEMT of claim 11 wherein the second Group III Nitride HEMT barrier layer comprises Aluminum Nitride.

13. A high electron mobility transistor (HEMT) comprising:
- a Gallium Nitride channel layer that is not actively doped;
- an Aluminum Indium Nitride barrier layer that is not actively doped directly on the Gallium Nitride channel layer; and
- a Group III Nitride cap layer directly on the Aluminum Indium Nitride barrier layer opposite the Gallium Nitride channel layer, wherein:
- the Group III Nitride cap layer includes a drain region, a source region, and a gate region, wherein:
- the Group III Nitride cap layer has a continuous surface on the drain region, the source region, and the gate region;
- the gate region is doped with impurities having a first conductivity type; and
- the drain region and the source region are doped with impurities having a second conductivity type that is opposite the first conductivity type so that the Group III Nitride cap layer is doped with opposite conductivity type impurities,
- wherein a thickness of the Aluminum Indium Nitride barrier layer is between about 1 nanometer and about 3 nanometers, and
- wherein an Indium Nitride concentration in the Aluminum Indium Nitride HEMT barrier layer is equal to about 17 percent or to about 18 percent.

14. The predisposed HEMT of claim 2 wherein the Gallium Nitride channel layer includes a two-dimensional gas sub-layer, the first Aluminum Indium Nitride HEMT barrier layer is directly on the Gallium Nitride HEMT channel layer, and the Group III Nitride HEMT cap layer is directly on the first Aluminum Indium Nitride HEMT barrier layer.

15. The HEMT transistor of claim 14, wherein the first Aluminum Indium Nitride barrier layer is not actively doped.

16. A high electron mobility transistor (HEMT) comprising:
- a Gallium Nitride channel layer;
- a second Group III Nitride barrier layer directly on the Gallium Nitride channel layer
- a first Group III Nitride barrier layer directly on the second Group III Nitride barrier layer; and
- a Group III Nitride cap layer on the first Group III Nitride barrier layer, wherein:
- the Group III Nitride cap layer includes a drain region, a source region, and a gate region, wherein:
- the Group III Nitride cap layer has a continuous surface on the drain region, the source region, and the gate region;
- the gate region is doped with impurities having a first conductivity type; and
- the drain region and the source region are doped with impurities having a second conductivity type that is opposite the first conductivity type so that the Group III Nitride cap layer is doped with opposite conductivity type impurities,
- wherein a thickness of the first Group III Nitride barrier layer is between about 1 nanometer and about 3 nanometers, and
- wherein a thickness of the second Group III Nitride barrier layer is between about 0.5 nanometers and about 2 nanometers and the second Group III Nitride barrier layer is not doped.

17. The HEMT transistor of claim 16, wherein the Group III Nitride cap layer is directly on the first Group III Nitride barrier layer.

18. The HEMT transistor of claim 17, wherein the first Group III Nitride barrier layer is a first Aluminum Indium Nitride barrier layer.

19. The HEMT transistor of claim 18, wherein an Indium Nitride concentration in the first Aluminum Indium Nitride barrier layer is equal to about 17 percent or to about 18 percent.

* * * * *